United States Patent
Arney et al.

(10) Patent No.: US 6,944,008 B2
(45) Date of Patent: Sep. 13, 2005

(54) CHARGE DISSIPATION IN ELECTROSTATICALLY DRIVEN DEVICES

(75) Inventors: Susanne Arney, Highland Park, NJ (US); Arman Gasparyan, New Providence, NJ (US); Sungho Jin, San Diego, CA (US); Omar D. López, Summit, NJ (US); Herbert R. Shea, Washington Township, Bergen County, NJ (US)

(73) Assignees: Lucent Technologies Inc., Murray Hill, NJ (US); Agere Systems Inc., Allentown, PA (US)

( * ) Notice: Subject to any disclaimer, the term of this patent is extended or adjusted under 35 U.S.C. 154(b) by 169 days.

(21) Appl. No.: 10/323,522

(22) Filed: Dec. 18, 2002

(65) Prior Publication Data

US 2004/0125536 A1 Jul. 1, 2004

(51) Int. Cl.[7] .............................. H01G 4/06; H01G 7/06

(52) U.S. Cl. .................................... 361/311; 361/281
(58) Field of Search .................. 361/311–314, 301.2, 361/301.4, 303–305, 306.2, 277, 278, 287, 280, 281–282

(56) References Cited

U.S. PATENT DOCUMENTS 5,949,944 A      9/1999  Minford et al.
2002/0139647 A1 * 10/2002  Bernstein ................. 200/61.49

* cited by examiner

Primary Examiner—Eric W. Thomas

(57) ABSTRACT

A charge-dissipation structure is formed within the dielectric of an electrostatically driven device, such as a micro-electro-mechanical systems ("MEMS") device, by ion implantation. Electrical and other properties of the charge-dissipation structure may be controlled by selection of the species, energy, and dose of implanted ions. With appropriate properties, such a charge-dissipation structure can reduce the effect on device operation of mobile charges in or on the dielectric.

20 Claims, 2 Drawing Sheets

CHARGE DISSIPATION IN ELECTROSTATICALLY DRIVEN DEVICES

BACKGROUND OF THE INVENTION

This invention relates to charge dissipation in electrostatically driven devices, such as micro-electro-mechanical systems ("MEMS") devices.

In a typical MEMS device, a movable structure that includes a conductive member is resiliently mounted to a substrate. Resilient mounting may be effected by, e.g., one or more micromachined springs, a membrane, a cantilever, or a torsional plate. The substrate includes one or more fixed conductive electrodes that are supported, and are insulated from each other and from the movable conductive member, by dielectric material. Applying a potential difference between the movable conductive member and one or more of the fixed electrodes produces an attractive electrostatic force urging the movable structure toward the fixed electrodes. The resilient mounting of the movable structure provides a restoring force.

In certain applications, the deflection of a MEMS device's movable structure ideally would be a unique function of the potentials of each of the fixed electrodes and the movable conductive member. If it were, the device could be operated in an open-loop manner; application of predetermined constant voltages to the fixed electrodes with respect to the movable conductive member would produce forces on the movable structure causing it to assume a well-defined position and then remain at that position for as long as the predetermined constant voltages continued to be applied.

Real dielectrics are imperfect, and when voltages are applied to the fixed electrodes of a MEMS device, charges may move in or on the dielectric that separates the electrodes. Charges can move within the dielectric due to filling or emptying of charge traps in the dielectric, and mobile ions can migrate along the surface of the dielectric. Such moving charges cause a time-dependent electrostatic force on the movable structure, whose position thus changes with time ("drifts") in response to the changing force, even if the voltages applied to the electrodes are held constant. Drift can be a problem in electrostatically driven devices.

One solution to drift problems would be to provide sensors responsive to the position of the movable structure and feedback electronics, and to adjust the voltages applied to the electrodes so as to maintain the movable structure in a desired position. However, such sensors and feedback electronics can be costly and bulky, and can dissipate far more power than the MEMS device.

A solution to drift problems arising from mobile charges in the dielectric of certain electrostatically driven devices has been to deposit or grow a thin conductive layer, referred to as a charge-dissipation layer ("CDL"), on top of the dielectric to bleed off surface charge from the dielectric. For instance, U.S. Pat. No. 5,949,944 describes such a CDL for $LiNbO_3$ modulators, which like MEMS device are electrostatically driven and may experience problems due to accumulation of surface charges. A prior art CDL typically consists of a thin film of a poor conductor, for example, a thin film of a doped oxide.

Prior art processes to create CDLs may require elevated temperature processing, and may require lithography or masking in order to restrict deposition of material to particular areas. The electrical properties of CDLs produced by prior art processes may be difficult to control, and the CDL electrical properties may change due to oxidation or corrosion unless extra processing steps are taken to protect the CDL.

SUMMARY OF THE INVENTION

Problems of the prior art are addressed by an implanted-ion charge-dissipation structure within the dielectric of an electrostatically driven device. Implanting ions within the dielectric increases the conductivity of the dielectric in the region where the ions are implanted, and such a region of increased conductivity can provide a charge dissipation structure that reduces the effect on device performance of mobile charges within or on the surface of the dielectric. Ion implantation to form a charge dissipation structure within a dielectric can be performed without masking, lithography, or elevated temperatures, the electrical properties of such a charge dissipation structure can be controlled relatively easily, and an implanted ion charge dissipation structure is protected from oxidation and corrosion by the dielectric within which it is formed.

BRIEF DESCRIPTION OF THE DRAWINGS

The foregoing and other aspects, features, and advantages of the invention will become more fully apparent from the following detailed description, the appended claims, and the accompanying drawings in which:

DETAILED DESCRIPTION

Figure 1:
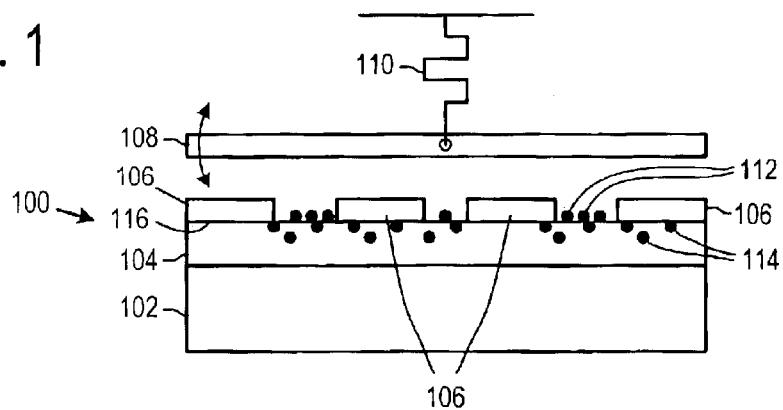
FIG. 1 is a schematic diagram illustrating the elements of a MEMS device in which the invention may be employed.

FIG. 1 is a schematic diagram illustrating the elements of an electrostatically driven device in which the invention may be employed. The device illustrated is an optical MEMS device, sometimes referred to as a micro-opto-electro-mechanical systems ("MOEMS") device, in which movement of the movable structure affects the optical properties of the device. The MOEMS device of FIG. 1 includes electrostatic driving structure 100 and movable structure 108. Movable structure 108 is disposed adjacent to, and movable with respect to, electrostatic driving structure 100. Electrostatic driving structure 100 includes a plurality of conductive electrodes 106, such as metal or polysilicon electrodes, which are formed upon and supported by surface 116 of dielectric 104. Dielectric 104 may be, for example, a dielectric layer that is formed upon or as a part of substrate 102. Movable structure 108 includes a conductive reflector, such as a conductive silicon micromirror, and is supported by a resilient mounting structure 110, such as micromachined springs, adjacent electrodes 106.

Movable structure 108 is illustrated as pivotably mounted. Applying a potential difference between the conductive reflector of movable structure 108 and an electrode 106 tilts movable structure 108 towards the energized electrode. If a light beam is directed at the conductive reflector, varying the tilt angle of movable structure 108 varies the angle of the reflected beam, and devices such as that of FIG. 1 may be used in beam-directing applications such as optical cross-connects.

Dielectric 104 insulates electrodes 106 from each other and from other device components. Common dielectric materials used in MEMS devices include silicon oxide and silicon nitride, which are good insulators and are commonly used dielectrics in the integrated circuit manufacturing industry. Typically movable structure 108 and resilient mounting structure 110 are fabricated on one wafer, the electrostatic driving structure 100 (including dielectric 104 and electrodes 106) is fabricated on another wafer, and then the wafers (or parts thereof) are "flip-chip'ed" together to form completed devices. Alternatively, for example, movable structure 108, resilient mounting structure 110, and electrostatic driving structure 100 might be fabricated in a monolithic device using surface micromachining.

As indicated above, dielectric 104 may contain electron or hole charge traps, as well as mobile ions on surface 116. Charge can slowly build up on or in dielectric 104 when electrodes 106 are biased and an electric field is imposed across dielectric 104. Such charge can include mobile surface charges 112 and mobile charges 114 within dielectric 104 that move into or out of charge traps in response to applied electric fields.

The potential difference between electrodes 106 can be changed in a very short time, e.g., much less than 1 millisecond. However, charges 112 and 114 move relatively very slowly. After a change in potential difference between electrodes 106 has been applied, the charge distribution on and/or in dielectric 104 might continuously change over many hours or many days, even though the potential on electrodes 106 remains fixed. As indicated above, such slowly moving charges 112 and/or 114 on or in dielectric 104 exert a slowly changing electrostatic force on movable structure 108, which then slowly drifts from its initial position as set by the potentials of electrodes 106.

Figure 2:
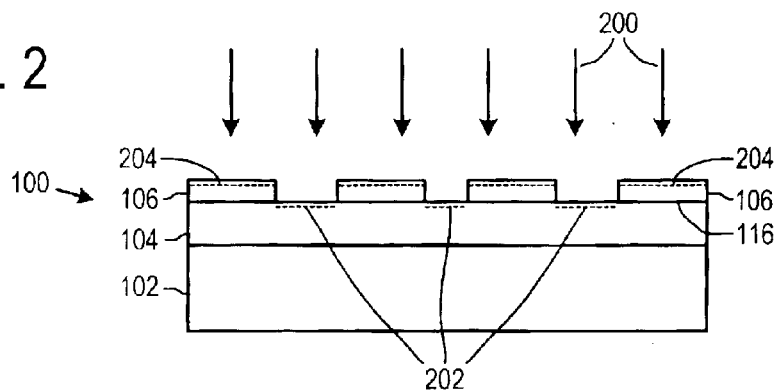
FIG. 2 is a schematic diagram illustrating the formation of a charge-dissipation structure in accordance with an embodiment of the invention.

In accordance with the invention, a charge-dissipation structure is formed within the dielectric of an electrostatically driven device by ion implantation. FIG. 2 is a schematic diagram illustrating the formation of a charge-dissipation structure in accordance with an embodiment of the invention. Ions 200 are directed at electrostatic driving structure 100 so as to impinge at least a portion of surface 116 and implant within dielectric 104. Implantation of ions 200 forms a charge-dissipation structure 202 within dielectric 104, rather than upon surface 116 of dielectric 104 as in the prior art.

The charge-dissipation structure of the invention is a region of dielectric 104 in electrostatic driving structure 100 having higher conductivity than the bulk material of dielectric 104. Charge-dissipation structure 202 may drain surface charges 112 from surface 116, and/or shield or screen charges 114 from movable structure 108. Preferably, charge-dissipation structure 202 is sufficiently conductive such that the effect on the device of mobile charges is less than it would be if the conductivity of the region were that of the bulk material of dielectric 104. Preferably, charge-dissipation structure 202 is coupled to one or more electrodes 106 so that its potential is determined by the potentials of the electrodes.

Implanting "dopant" ions in a region within dielectric 104 may increase the conductivity of the region in several ways. Ions 200 may include conductive species such as metal ions; such implanted ions contribute directly to the conductivity of the charge-dissipation structure. Gold and antimony ions are conductive species that are suitable for use as dopants for an implanted charge-dissipation structure. In addition or alternatively, ions 200 may include semiconducting and/or insulating species; such implanted ions damage or disrupt the lattice structure of the dielectric, thereby indirectly increasing the conductivity of the charge-dissipation structure. Argon and xenon ions are nonconductive species that are believed suitable for use as dopants for an implanted charge-dissipation structure.

Figure 3:
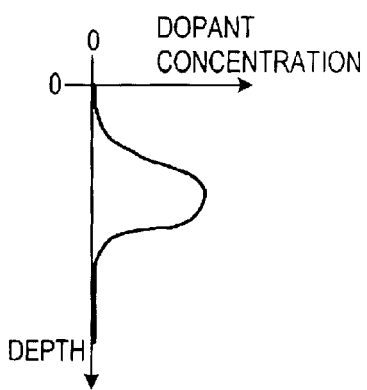
FIG. 3 is a graph illustrating an example of dopant concentration as a function of depth in a charge-dissipation structure in accordance with an embodiment of the invention.

FIG. 3 is a graph illustrating an example of dopant concentration in a dielectric as a function of depth in a charge-dissipation structure in accordance with an embodiment of the invention. The concentration-versus-depth function illustrated results from implanting ions of a single species with substantially uniform energies. In such circumstances, most of the ions are stopped by the host material in which they are implanted in a relatively short range. For example, when applicants implanted 20 keV Au ions in an $SiO_2$ dielectric layer, approximately 90% of the ions were captured in a region 7 nm thick centered 20 nm below the surface of the dielectric. If the implanted dose is high, the concentration of the implanted species can be very high, even greater than the concentration of the host species. For example, when applicants implanted gold ions at a dose of $5 \times 10^{16}$ ions/$cm^2$ and an ion energy of 20 keV in an $SiO_2$ dielectric, a layer was formed in which the concentration of gold atoms exceeded 50%, i.e., the number of gold atoms exceeded the number of $SiO_2$ molecules.

In the device of FIG. 1, the charge-dissipation structure 202 is preferably disposed closely adjacent surface 116 of dielectric 104. Disposing charge-dissipation structure 202 closely adjacent surface 116 of dielectric 104 improves electrical coupling between charge-dissipation structure 202 and electrodes 106 as well as between charge-dissipation structure 202 and surface charges 112. It also reduces the volume of dielectric 104 within which charges 114 are not screened from movable structure 108 by a conductor.

The conductivity of the implanted layer can be controlled by appropriate choice of the dopant ion species, implant energy, and dose, while the depth of the implanted layer can be controlled by appropriate choice of the implant energy and dopant ion species. The conductivity-versus-depth function can be very accurately tuned. In order to provide a charge-dissipation structure with desired characteristics, the ion implantation process may include several successive implantations having differing parameters such as energy, dose, ion species, beam angle, and substrate temperature. Each successive implantation may have a shape that is generally like that illustrated in FIG. 3, but with a peak depth and peak concentration differing from those of other implantations.

The dose of implanted ions plays an important role. If the dose of implanted ions is too large, too many ions accumulate, which can damage the dielectric, for instance by causing cracks. Too large a dose of metal ions can create precipitates of the implanted metal, thereby creating a low impedance path between neighboring electrodes. Low impedance between neighboring electrodes, and resulting high leakage current between them, can lead to device malfunction, for example, due to inability of the power supply to source the required current, or because of local Joule heating from the high current. If the dose of implanted ions is too small, the implanted ions might simply damage the dielectric, creating many hole or electron traps, without creating a structure that is sufficiently conductive to dissipate or screen mobile charges. Thus, implanting too small a dose of ions can significantly worsen the problem of mobile charges on or in the dielectric. There is a range of implant doses, which may be a relatively narrow range, that provides good enough conductivity to screen or dissipate mobile charges without either shorting out the electrodes or merely damaging the dielectric.

Creating a charge-dissipation structure by ion implantation has a number of advantages over depositing or patterning a thin CDL on the surface of a dielectric. Ions can be implanted in metal or silicon electrodes without significantly degrading their electrical characteristics. The implantation process can thus direct ions at both electrode areas and dielectric areas of an electrostatically driven device, and typically there is no need for lithography or masking. Ion implantation can be done at room temperature. The depth and conductivity of a charge-dissipation structure formed by ion implantation are readily tuned. Film stress is controllable in ion implantation. A charge-dissipation structure formed by ion implantation is automatically encapsulated under a thin layer of dielectric, which protects the charge-dissipation structure from corrosion or oxidation.

Applicants have fabricated a number of MEMS devices like that of FIG. 1 in which movable structure 108 included a conductive micromirror and electrostatic driving structure 100 included $SiO_x$ dielectric 104 and aluminum electrodes 106. The surface of electrostatic driving structure 100 in some instances was not implanted and in other instances was irradiated with metal ions to implant them in $SiO_x$ dielectric 104 and aluminum electrodes 106. Applicants implanted such devices with gold or antimony ions, using doses of ions from about $10^{13}$ ions/cm$^2$ to about $10^{17}$ ions/cm$^2$ and accelerating voltages producing ion energies of from about 15 keV to about 50 keV. The susceptibility of the devices to adverse effects caused by mobile charges was determined by applying fixed potentials to electrodes 106 and measuring the tilt angle of the micromirror over time.

Figure 4:
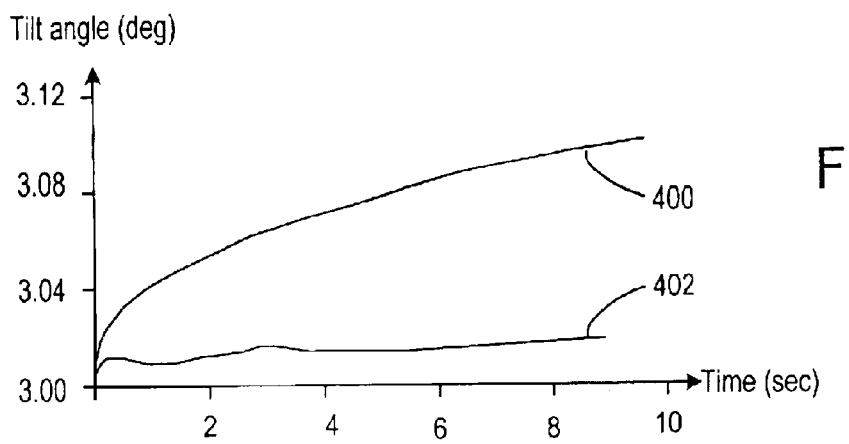
FIG. 4 is a graph comparing examples of the drift of a prior art MEMS device and the drift of a MEMS device in accordance with an embodiment of the invention.
Figure 5:
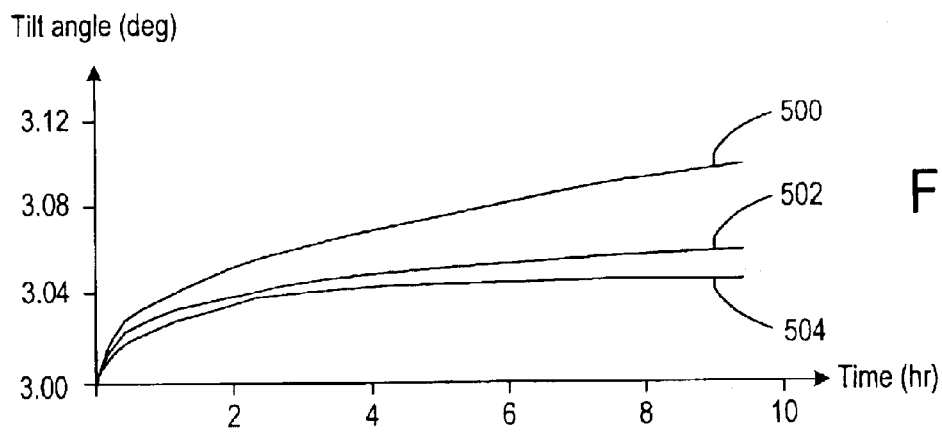
FIG. 5 is a graph comparing other examples of the drift of a prior art MEMS device and the drift of MEMS devices in accordance with embodiments of the invention.

With the particular device structure and materials, applicants obtained the best results, i.e., smallest drift of the micromirror tilt angle, using gold ions implanted at 20 keV at a dose of $5\times10^{16}$ ions/cm$^2$. FIG. 4 is a graph comparing the drift of an unimplanted MEMS device (curve 400) with the drift of a MEMS device having a charge-dissipation structure created by implanting gold ions at a dose of $5\times10^{16}$ ions/cm$^2$ and an ion energy of 20 keV (curve 402). FIG. 5 is a graph comparing the drift of an unimplanted MEMS device (curve 500) with the drift of two MEMS devices having charge-dissipation structures created by implanting gold ions at an ion energy of 50 keV. Curve 502 shows the device drift with a charge-dissipation structure created by implanting gold ions at a lower dose of $2.15\times10^{16}$ ions/cm$^2$, and curve 504 shows the device drift with a charge-dissipation structure created by implanting gold ions at a higher dose of $4.3\times10^{16}$ ions/cm$^2$. The reduction in drift provided by the implanted ion charge-dissipation structure is clearly seen in FIGS. 4 and 5.

Figure 6:
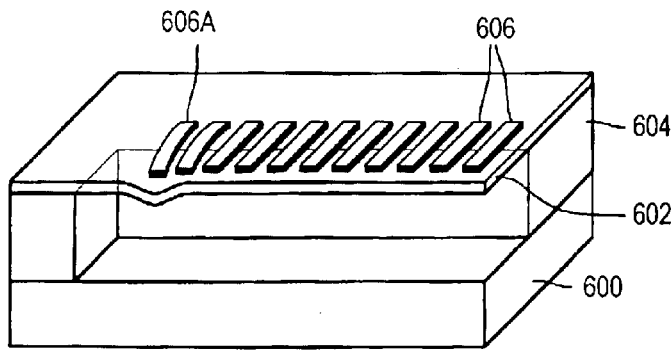
FIG. 6 is a schematic diagram illustrating the elements of another device in which the invention may be employed.

FIG. 6 is a schematic diagram illustrating the elements of another electrostatically driven MOEMS device in which the invention may be employed. The device of FIG. 6 is an optical modulator that variably attenuates an incident light beam. The device includes a conductive substrate 600 that may, for example, be made of silicon. Dielectric membrane 602, which may be made of silicon nitride (SiN), is disposed spaced apart from substrate 600 and is supported in that disposition by support 604, which may be made of phospho-silicate glass. Such a structure may be formed by depositing a layer of SiN on a layer of phospho-silicate glass, and then "releasing" a portion of the SiN layer by etching the phospho-silicate glass underneath it to enable the released portion to move.

A plurality of electrodes 606 are disposed on membrane 602, and when voltages are applied to them with respect to conductive substrate 600, the resulting electrostatic forces deflect membrane 602 toward substrate 600. FIG. 6 illustrates such deflection resulting from a voltage between substrate 600 and the leftmost electrode 606A. A light beam passing through membrane 602 and reflecting from substrate 600 may be subject to constructive or destructive interference that is a function of the separation of membrane 602 and substrate 600, and so the attenuation of such a light beam may be controlled by controlling the voltages applied to electrodes 606.

Unlike the device of FIG. 1, it is the movable structure in the FIG. 6 device which includes dielectric that is susceptible to mobile charges which can cause slowly varying electrostatic forces and position drift of the movable structure. The upper surface of membrane 602 adjacent electrodes 606, and the lower surface of membrane 602, are both subject to accumulation of mobile surface charges. The bulk of membrane 602 may contain charge traps, to which or from which charge may slowly flow. Accordingly, a thin layer of ions implanted near the top surface of membrane 602 adjacent electrodes 606 may not sufficiently reduce the effect on device performance of mobile charges in or on membrane 602. In accordance with embodiments of the invention, a charge-dissipation structure in a dielectric is formed by several implants with different ion energies. A charge-dissipation structure thus formed may include several layers of increased conductivity or a single layer of increased conductivity extending generally through membrane 602, reducing mobile surface charges and shielding electrodes from the effects of mobile charges within the dielectric.

For dielectric membranes such as membrane 602, stress control may be important. Implanting ions changes the stress of the membrane, which can severely negatively impact a device's performance. When selecting ion energies, ion doses, and the species of ion to be implanted, care must be taken to keep membrane stress at acceptable levels.

Applicants implanted gold ions with several different energies to form charge-dissipation structures in the membranes of devices like that of FIG. 6. In one example, before irradiation, the device was unable to maintain its attenuation state for more than one minute. Upon applying 23V to the virgin membrane, the device reached 10 dB of attenuation in the reflected signal. After five minutes the attenuation was 15 dB, and after two more minutes the membrane snapped down, making its control impossible.

After irradiating such a device with 30 keV gold ions at a dose of $5\times10^{14}$ ions/cm$^2$, the membrane snapped down shortly after voltage was initially applied to the electrodes, but after about two hours the membrane recovered its initially flat form. The device attenuation drifted from 10 db to 15 dB in fifteen minutes. The same irradiation was applied to an SiN membrane during fabrication of such a device before the membrane was released, with similar results; the device drift was reduced and the membrane maintained a flat shape.

In another example, in order to dope the dielectric more uniformly, two implants were made to unreleased membranes in devices like that of FIG. 6. Applicants used doses of $7 \times 10^{14}$ ions/cm$^2$ at 500 keV and $9 \times 10^{14}$ ions/cm$^2$ at 1.4 MeV. While these higher-dose implants introduced additional stress in the membrane, the dose of $7 \times 10^{14}$ ions/cm$^2$ reduced drift considerably without changing the profile of the membrane. In that case, a 10-dB attenuation state was stable for hours and no membrane snap-down was detected.

Figure 7A:
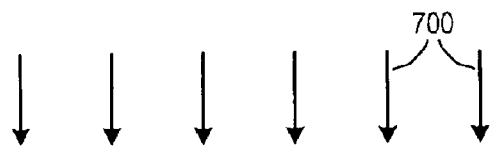
FIG. 7A is a schematic diagram illustrating the formation of a charge-dissipation structure in accordance with another embodiment of the invention.
Figure 7A:
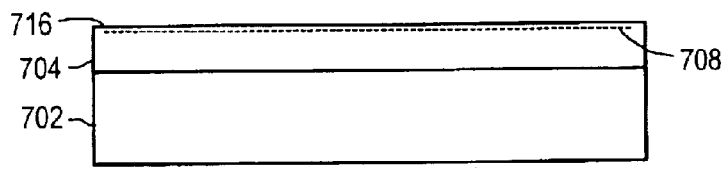
Figure 7B:
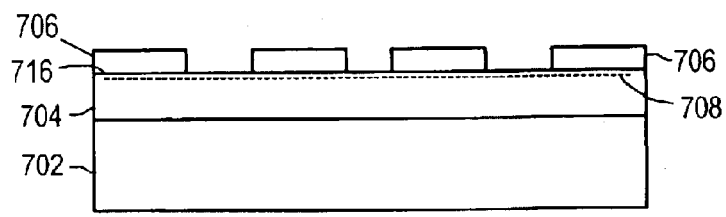
FIG. 7B is a schematic diagram illustrating a device having such a charge-dissipation structure.

FIG. 7A is a schematic diagram illustrating the formation of a charge-dissipation structure in accordance with another embodiment of the invention, and FIG. 7B is a schematic diagram illustrating a device having such a charge-dissipation structure. Ions 700 are directed at surface 716 of dielectric 704 and implant within dielectric 704 to form a charge-dissipation structure 708 within dielectric 704. After formation of charge-dissipation structure 708, electrodes 706 are formed on surface 716 to provide an electrostatic driving structure. As with the charge-dissipation structure in the device of FIG. 2, masking and lithography are not needed to form charge-dissipation structure 708 in the device of FIG. 7B. Implanting a charge-dissipation structure prior to forming electrodes avoids any problems that might arise from implanting ions in electrodes, and provides better coupling between the electrodes and the charge-dissipation structure.

Although the invention has been described with respect to electromechanical devices such as MEMS devices, it should be understood that it may be applied to other types of electrostatically driven devices. For instance, an implanted-ion CDL may be formed in a lithium niobate modulator.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments.

It will be further understood that various changes in the details, materials, and arrangements of the parts which have been described and illustrated in order to explain the nature of this invention may be made by those skilled in the art without departing from the scope of the invention as expressed in the following claims.

We claim:

1. A product made by a method comprising forming a charge-dissipation structure in a device, wherein the device comprises:
    a dielectric;
    at least one electrode disposed on a surface of a first portion of the dielectric, wherein the first portion and the at least one electrode form an electrode region of the device; and
    the charge-dissipation structure formed in the electrode region and in a second portion of the dielectric located outside of the electrode region.

2. The invention of claim 1, wherein a part of the charge-dissipation structure is formed in the at least one electrode.

3. The invention of claim 1, wherein a part of the charge-dissipation structure is formed in the first portion of the dielectric.

4. The invention of claim 1, wherein forming the charge-dissipation structure comprises implanting ions of at least one of argon and xenon.

5. A device comprising:
    a dielectric;
    at least one electrode disposed on a surface of a first portion of the dielectric, wherein the first portion and the at least one electrode form an electrode region of the device; and
    a charge-dissipation structure formed in the electrode region and in a second portion of the dielectric located outside of the electrode region.

6. The invention of claim 5, wherein the charge-dissipation structure includes implanted ions.

7. The invention of claim 6, wherein the ions include gold or antimony ions, the ions are implanted with energies of between about 15 keV and about 50 keV, and the dose of ions implanted is between about $10^{13}$ ions/cm$^2$ and about $10^{17}$ ions/cm$^2$.

8. The invention of claim 6, wherein the ions are implanted so as to reduce the effect on the device of mobile charges on or in the dielectric.

9. The invention of claim 6, wherein the ions include non-metal ions.

10. The invention of claim 6, wherein the conductivity of the dielectric having ions implanted therein is greater than the conductivity of the dielectric would be without ions implanted therein.

11. The invention of claim 5, wherein the device is an electro-mechanical system.

12. The invention of claim 11, wherein a stationary part of the device includes the charge dissipation structure.

13. The invention of claim 11, wherein a moving part of the device includes the charge dissipation structure.

14. The invention of claim 5, wherein the charge-dissipation structure includes a thin conductive layer below and adjacent the surface of the dielectric.

15. The invention of claim 5, wherein ions are implanted in the electrode.

16. The invention of claim 5, wherein the charge-dissipation structure includes a thin conductive layer below and adjacent a portion of the surface of the dielectric on which the electrode is disposed.

17. The invention of claim 5, wherein a part of the charge-dissipation structure is formed in the at least one electrode.

18. The invention of claim 5, wherein a part of the charge-dissipation structure is formed in the first portion of the dielectric.

19. The invention of claim 5, wherein the charge-dissipation structure comprises ions of at least one of argon and xenon.

20. A device comprising:
    a dielectric;
    at least one electrode disposed on a surface of the dielectric; and
    a charge-dissipation structure in the dielectric, wherein:
        the charge-dissipation structure includes implanted ions;
        the device is an electro-mechanical system; and
        a moving part of the device includes the charge-dissipation structure.

* * * * *